United States Patent [19]

McKenzie, Jr.

[11] Patent Number: 5,140,745
[45] Date of Patent: Aug. 25, 1992

[54] METHOD FOR FORMING TRACES ON SIDE EDGES OF PRINTED CIRCUIT BOARDS AND DEVICES FORMED THEREBY

[76] Inventor: Joseph A. McKenzie, Jr., 1933 Payton Cir., Colorado Springs, Colo. 80915

[21] Appl. No.: 556,080

[22] Filed: Jul. 23, 1990

[51] Int. Cl.⁵ .......................... H01K 3/10; H05K 1/00
[52] U.S. Cl. ...................................... 29/852; 29/412; 29/413; 174/263; 174/266; 361/403; 361/404; 361/406; 361/424; 427/97
[58] Field of Search ............ 29/852, 846, 830, 426.1, 29/412, 413; 361/403, 404, 406, 424, 395; 174/263, 266; 427/97, 98; 264/61

[56] References Cited

U.S. PATENT DOCUMENTS

| | | | |
|---|---|---|---|
| 3,398,232 | 8/1968 | Hoffman | 361/424 X |
| 4,223,321 | 9/1980 | Kenworthy | 29/846 X |
| 4,288,841 | 9/1981 | Gogal | 361/395 X |
| 4,372,046 | 2/1983 | Suzuki | 29/846 X |
| 4,463,218 | 7/1984 | Suzuki | 361/406 X |
| 4,681,656 | 7/1987 | Byrum | 361/406 X |
| 4,821,007 | 4/1989 | Fields et al. | 29/846 X |

OTHER PUBLICATIONS

IBM Technical Disclosure Bulletin, vol. 23, No. 12, May 1981, pp. 5595-5597, by R. E. Gegenwarth et al.

*Primary Examiner*—Carl J. Arbes
*Attorney, Agent, or Firm*—Cushman, Darby & Cushman

[57] ABSTRACT

During the manufacture of a printed circuit board, holes are drilled not only in accordance with a particular circuit board pattern, but also along the lines which will define edges of the board at the positions where traces are to appear. All of the holes are then plated through. The holes along the edges of the board are completely filled with solder. The board is then cut along the previously defined edge lines to cut the solder filled holes in half. This creates a trace and a solder reservoir along the edge of the board.

13 Claims, 8 Drawing Sheets

PGA, PROBE-CARD/PGA PINS, FLEX-CKT/PGA-PINS, EXTENDER HEADER OR SOCKET

PLCC SOCKET/.100 PGA FOOTPRINT, OR
PLCC SOCKET/PLCC-SMT FOOTPRINT

METHOD FOR FORMING TRACES ON SIDE EDGES OF PRINTED CIRCUIT BOARDS AND DEVICES FORMED THEREBY

BACKGROUND OF THE INVENTION

1. Field of the Invention

The present invention relates to printed circuit boards and, more particularly, to printed circuit boards having traces defined on the side edges thereof.

2. Description of the Related Art

As printed circuit board technology and chip mounting techniques have advanced, there has been an increasing need for chip mounting versatility. For example, there has been a desire to provide a means by which plastic leadless chip carrier (PLCC) sockets could be selectively converted to receive pin grid array (PGA) chips. Furthermore, there has been a desire to adapt surface mount boards to receive PLCC chips or to be interconnected with another surface mount board (mother board, daughter board, for example). Even further, there has been a desire to provide a means by which PLCC chips may be stacked in parallel.

It has been proposed to provide traces on the side of the printed circuit board for providing electrical connections between a PLCC socket and an adaptor for a different chip or another board. In accordance with that proposed configuration as illustrated in FIGS. 1A and 1B, slots 10 are made in a broad board which slots are then plated so as to define a metal layer along a portion of the side edges of the of the board. The gaps between slots are then severed along lines 12 so as to define a board having side edges which are at least in part defined by a metal plate. Cuts 14 (see FIG. 1B) are then made with a saw blade or drill at spaced locations along each metal plate so as to define discrete metal traces 16 on the side of the board. Traces 16 are sized and disposed so as to provide the necessary electrical connections with the leads of the PLCC socket.

The foregoing proposed tracing structure had the significant disadvantage that the surface defined traces could be easily ripped, chipped, delaminated, or removed which cuts 14 are made and in use.

SUMMARY OF THE INVENTION

It is an object of the invention to provide traces on the side edge of a printed circuit board which avoids the problems of surface defined traces of the type noted above and which advantageously enables the formation of devices which can convert a surface mount board into a board capable of receiving PLCC chips, can define an adaptor for converting a PLCC socket to a PGA header and/or which can stack PLCC chips and/or mount a PLCC chip to a surface mounted board (directly).

According to the present invention, while a printed circuit board is being manufactured, holes are drilled not only in accordance with a particular circuit board pattern, but also along lines which will define edges of the board at positions where traces are to appear. Then, traces on the surface of the board are applied and all of the holes are plated through employing well-known techniques. Then, all holes except for those along what will be the edges of the board are masked closed and those holes along the edges of the board are completely filled by a metal, such as solder. Then, the board is cut along the previously defined lines so as to cut the hole along the edges of the board in half. This creates a trace along the edge of the board.

If indentations are desired between traces on the edge of the boards, a second row of holes can be drilled along a line offset from the first line and slightly outboard inboard or in line with the edge. Since these holes are drilled after all holes have been plated and the holes along the edge of the board have been filled with solder, these second rows of holes are unplated and solder free. When the board is cut along the lines defining the edges, the second row of holes leave indentations between traces on the edges of the board.

DETAILED DESCRIPTION OF THE PRESENTLY PREFERRED EXEMPLARY EMBODIMENT

Figure 1A:
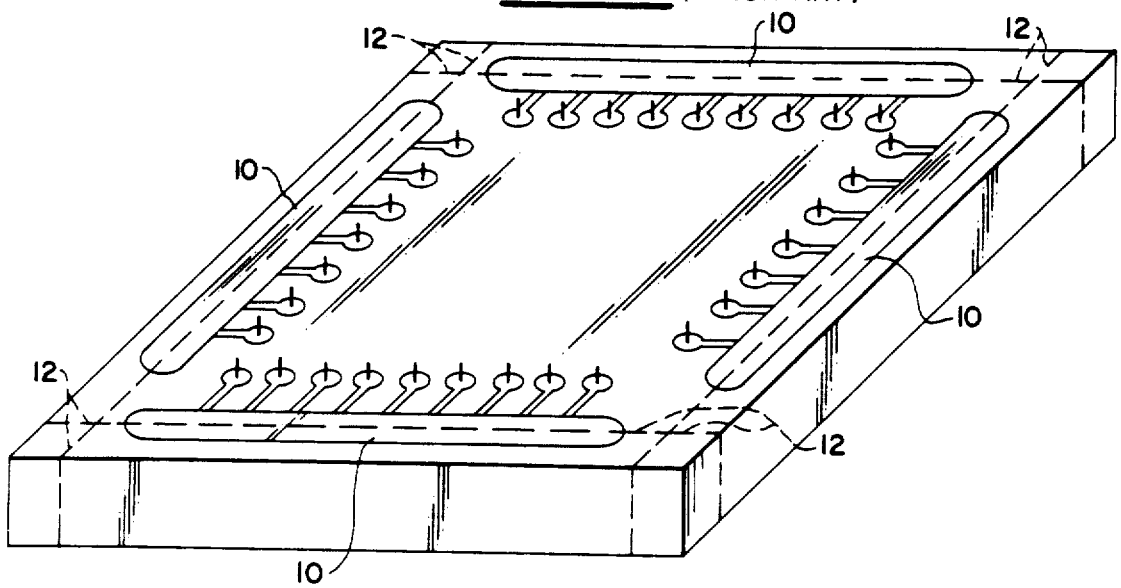
FIGS. 1A and 1B are perspective views of the prior art method of forming traces.
Figure 1B:
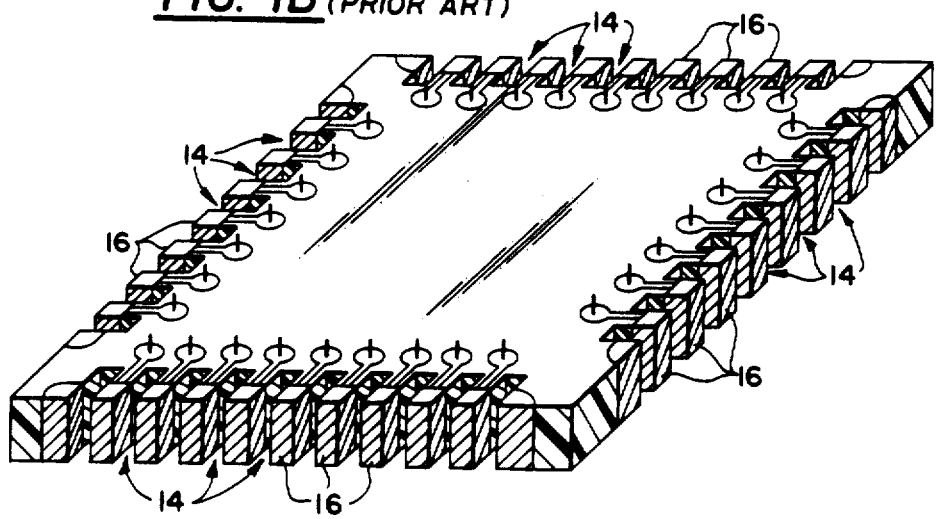
Figure 2A:
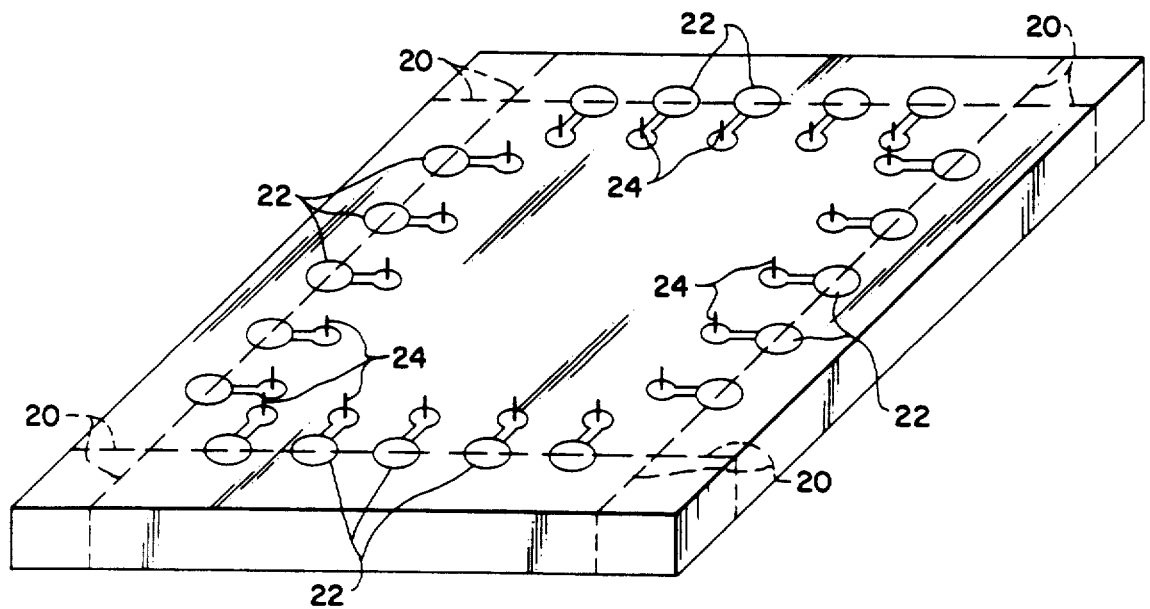
FIGS. 2A and 2B are perspective views of a method of forming traces in accordance with the present invention.
Figure 2B:
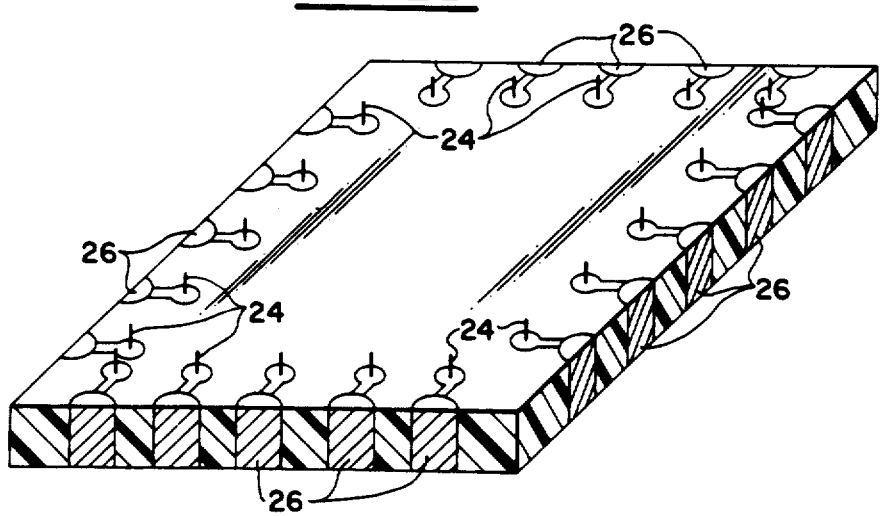

Referring to FIGS. 2A and 2B, to provide traces on the side edges 20 of a board in accordance with the present invention, a series of holes 22 are drilled in a board in a surrounding relation to a particular connector pattern including for example a particular pin grid array (PGA) 24, and/or female mosquito clips and/or male pins. All holes on the board are then plated through. All holes except holes 22 are then masked and holes 22 are completely filled with solder. Following addition of the solderable material, the board is severed along lines 20 so as to expose at least a portion of the solderable material which filled each of those holes. By cutting along the perimeter defined by the spaced bores, spaced traces 26e defined along the side edges of the circuit board.

Figure 3A:
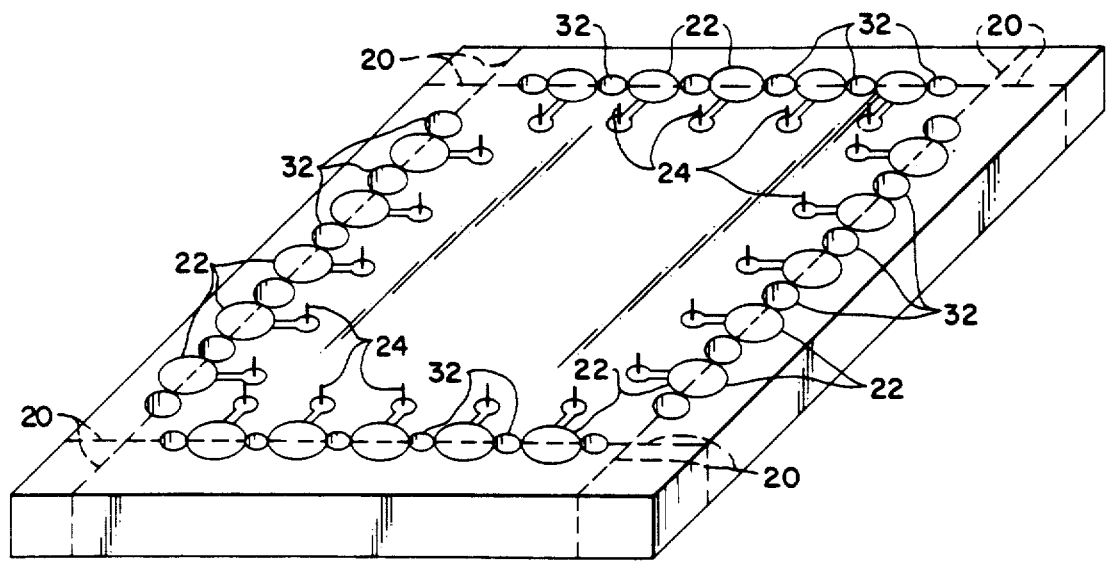
FIGS. 3A and 3B are perspective views of an alternate method in accordance with the present invention.
Figure 3B:
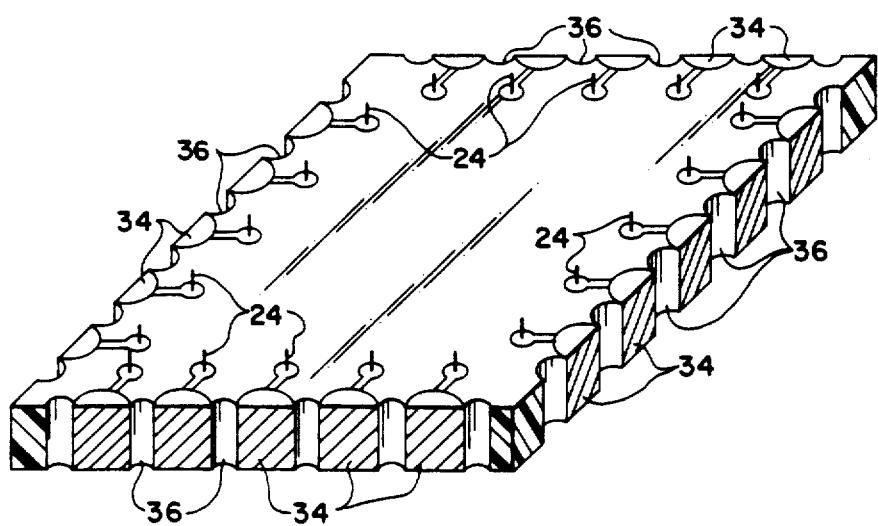

In the alternative, after a first array of apertures is drilled and filled with solderable material as shown in FIG. 2A, a second set of apertures 32, which are slightly off-set outwardly, inwardly or along the same line relative to the first array of holes 22 are drilled through the printed circuit board as illustrated in FIG. 3A. The board is then cut along lines 20 at the perimeter defined by the first set of holes 22 so as to define a plurality of discrete traces along the vertical side edges of the printed circuit board as illustrated in FIG. 3B. However, because second holes 32 were drilled slightly off-set from and adjacent each of the trace holes, grooves 36 are defined between each of traces 34 on the side edge of the printed circuit board. Because the trace material is not formed as a uniformly thick metal plate on the surface of the printed circuit board, but rather has a depth at the lateral center thereof which is greater than the depth at the side edges, the trace is formed in accordance with the present invention resists ripping, chipping, delamination or otherwise dislodging from the side edges of the printed circuit board. Printed circuit boards having traces in accordance with the present invention can be utilized in many ways to increase the usability and versatility of current mounting technology.

Figure 4:
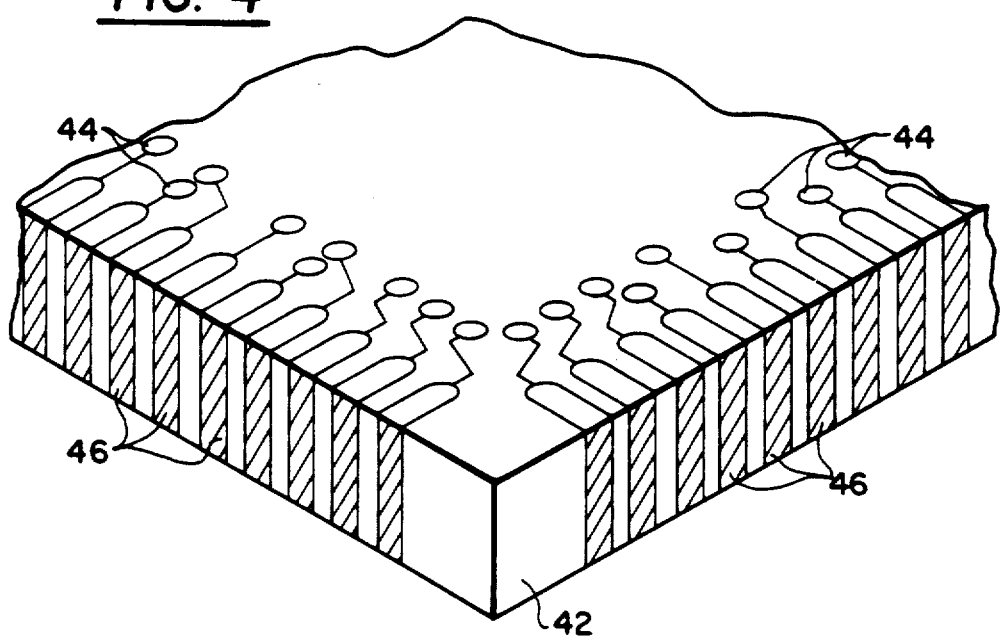
FIG. 4 is a perspective view, partly broken away for clarity, of a flexible circuit header in accordance with the invention.
Figure 5:
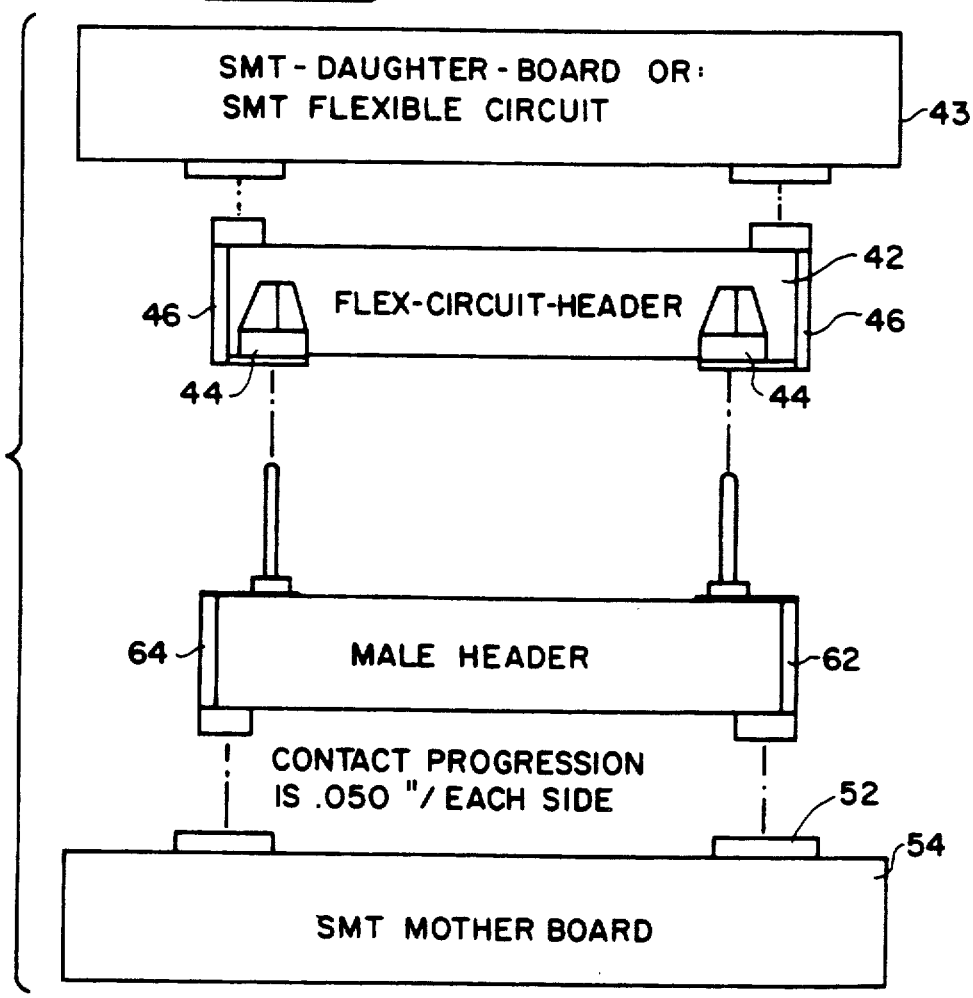
FIG. 5 is a schematic exploded view (elevational), of the use of a flexible circuit header in accordance with the invention.

For example, with reference to FIGS. 4 and 5, in accordance with a first embodiment of the invention, a flex-circuit-header 42 having traces formed in accordance with the invention is provided and used to facilitate the mounting of a surface mount daughter board or 43 having a solder pattern 45 to a surface mount mother board 54 having a solder pattern 52.

Figure 6:
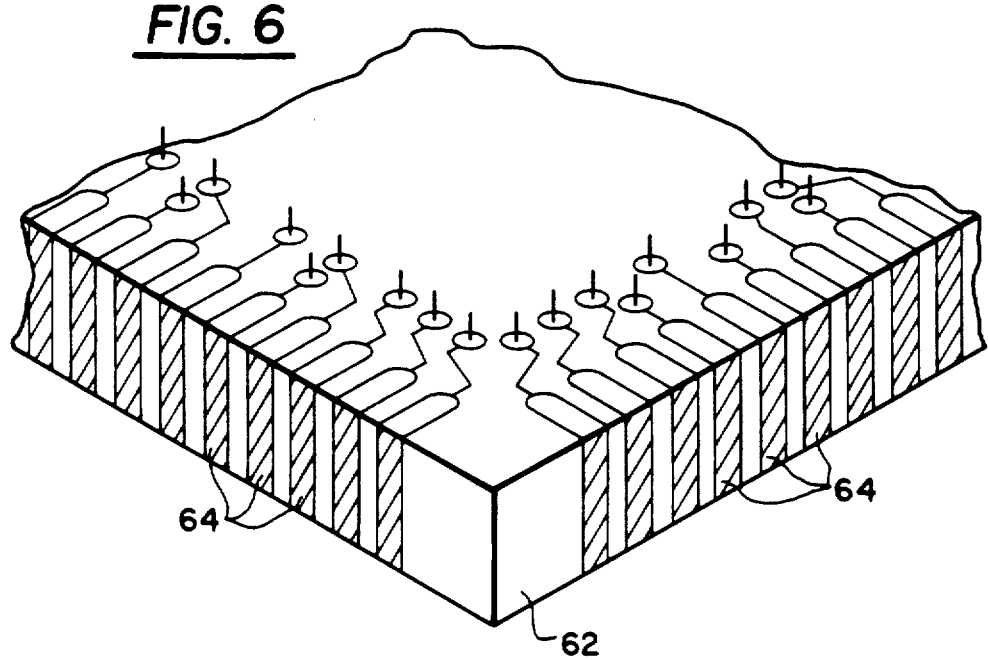
FIG. 6 is a perspective view of a male header provided in accordance with the present invention, partly broken away for clarity.

Thus, as shown in FIG. 5, a male header, for example a male header 62 having traces 64, as described below with reference to FIG. 6, is soldered to solder pattern 52. Likewise, the flex-circuit-header 42 is soldered to the daughter board 43. The side edge traces 46 aid solder flow and solder inspection to insure that the flex-circuit header 42 has been properly and completely mounted to the surface mount daughter board 43. The flex-circuit-header 42 and attached board 43 are then slidably mounted to the male header 42 and attached mother board 54.

Figure 7:
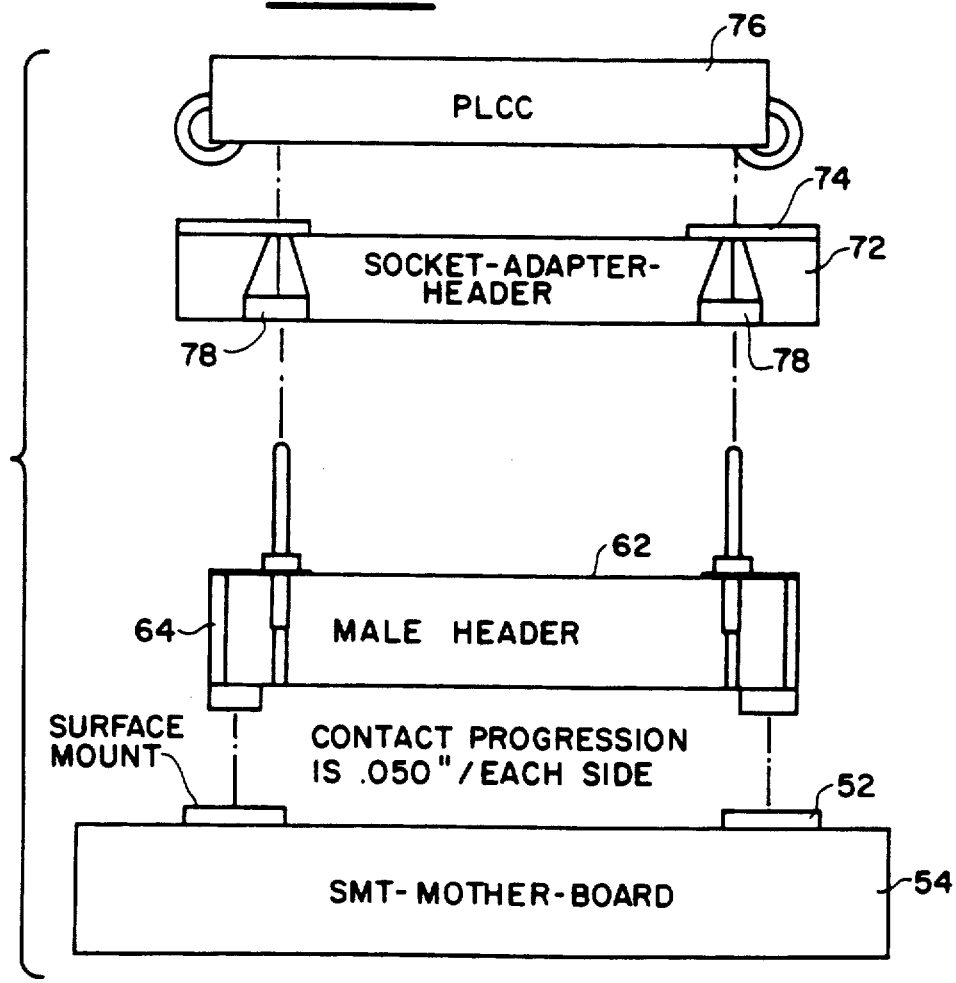
FIG. 7 is an exploded elevational view of the use of a male header in accordance with the present invention.

With reference to FIG. 7, in accordance with a second embodiment of the invention, a male header 62 (see FIG. 6) is provided having traces formed in accordance with the present invention to enable a PLCC chip to be mounted to a surface mount mother board. In accordance with this embodiment of the invention, side edge traces 64 are provided to aid solder flow and solder inspection. Thus, male header 62 provided in accordance with the present invention is aligned with solder pattern 52 provided on surface mount mother board 54 and soldered thereto. Once male header 62 has been mounted, a socket adaptor header 72 having a plurality of female mosquito clips 78 defined therein and a solder pattern 74 defined on an upper surface thereof is soldered to the pins of a PLCC chip 76 and slidably mounted to male header 62 of the invention. Thus in accordance with the invention a surface mount mother board can receive a PLCC chip. As noted above, the male header of the invention has the advantage that the side edge traces aid solder flow and solder inspection to insure that the male header has been properly and completely mounted to the surface mount mother board.

Figure 8:
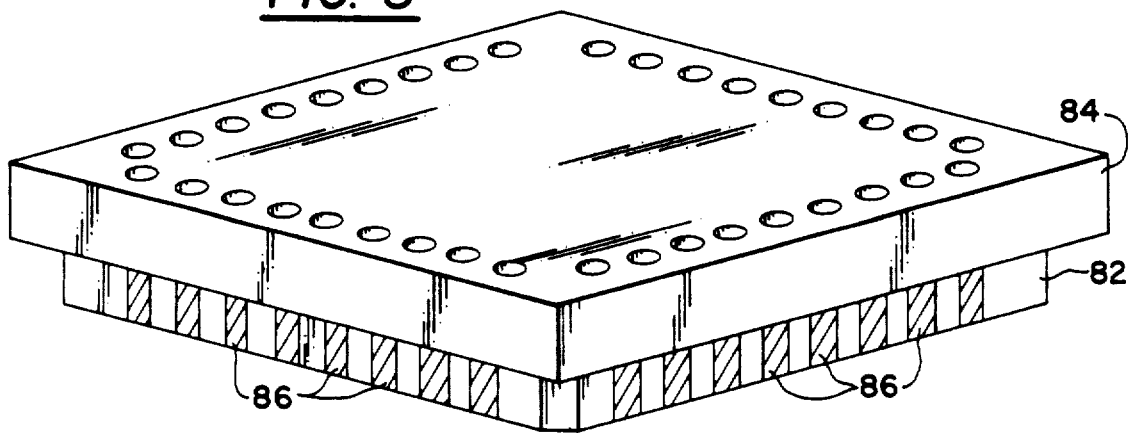
FIG. 8 is a perspective view of a PLCC socket to PGA header adaptor provided in accordance with the present invention.
Figure 9:
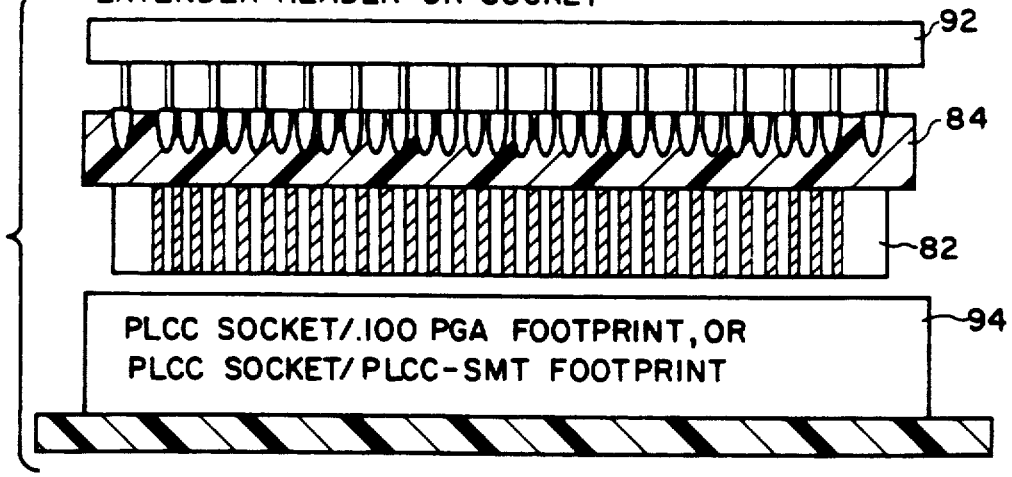
FIG. 9 is an exploded elevational view of a PLCC socket-PGA header adaptor in accordance with the invention.

It is also an object of this invention to provide an adaptor so that a PLCC socket can receive a PGA header. In accordance with the invention, such an adaptor is formed by drilling a series of holes about the periphery of a pin grid array. The trace defining holes are then filled with the suitable solderable material and/or conductive material. As can be seen in FIG. 8, the printed circuit board in accordance with this embodiment of the invention is particularly thick so as to provide a first portion 82 which is insertable into a PLCC socket 94 (see FIG. 9) and a second portion 84, which receives PGA chip 92 which extends vertically above PLCC socket 94 to enable insertion and removal of the same from PLCC socket 94. Traces 86 are defined by cutting away the printed circuit board about the periphery defined by the trace apertures. However, the board is severed to only about one half of its thickness so as to define upper portion 84 which is free from traces in accordance with the invention and a lower portion 82 having such traces 86. The unsevered end of the trace holes define internal leads to the particular pin grid array defined on the upper surface of the printed circuit board. Exposed traces 86 in accordance with the invention are smooth so as to provide the desired contact with the clips of the PLCC socket without requiring that the adaptor be soldered to the socket clips.

Figure 10:
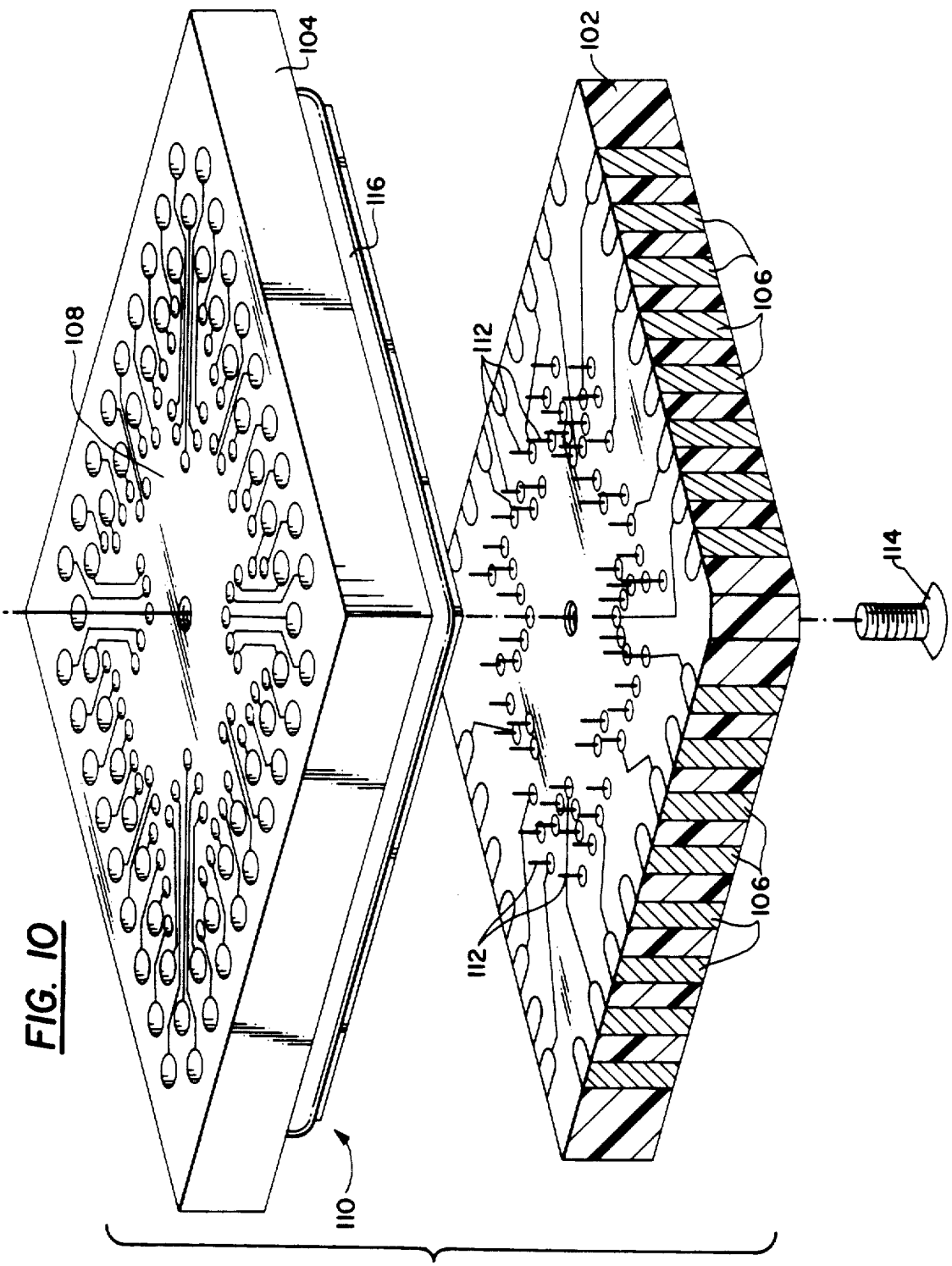
FIG. 10 is a perspective view, of a PLCC socket to PGA header adaptor formed in accordance with an alternate embodiment of the invention.
Figure 11:
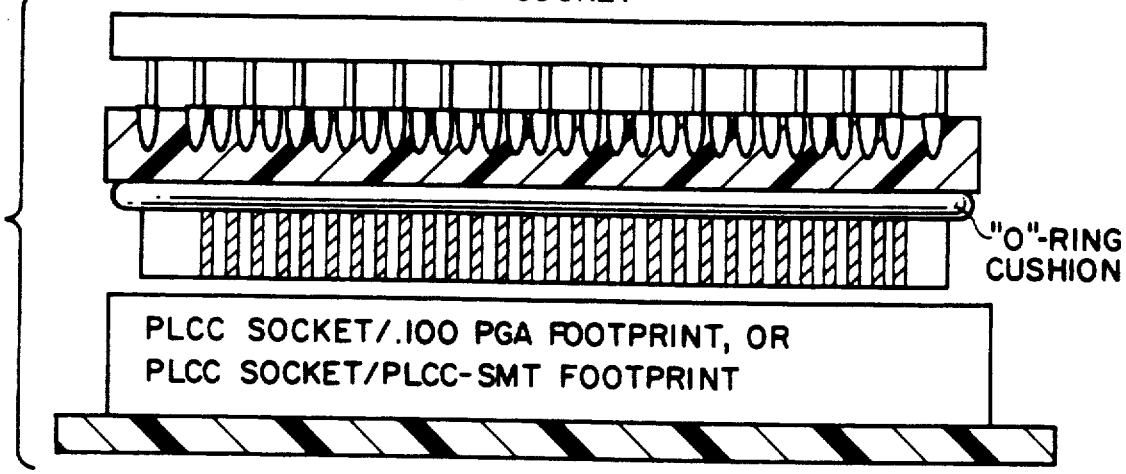
FIG. 11 is an exploded elevational view of a PLCC socket-PGA header adaptor in accordance with FIG. 10.

In accordance with a further alternate embodiment of the invention as illustrated in FIGS. 10 and 11, two boards 102 and 104 are used to form a PLCC socket-PGA header adaptor. Lower or bottom board 102 is formed so as to include a plurality of side edge traces 106 in accordance with the invention. Second board 104 which is free from such traces includes a pin array 108 on the upper surface thereof which may include a pin grid array, female mosquito clips, etc. The bottom surface of upper board 104 includes a plurality of clips for selectively engaging a plurality of pins 112 defined on the upper surface of the lower board. First and second boards 102 and 104 are secured together with, for example, a screw 114 to prevent the boards from disconnecting during removal from the PLCC socket or during removal of the PGA, etc. chip. An O-ring 116 for example, may be mounted between the boards to insure that the only electrical connection between the boards is provided by the male-female interconnection. Also, the O-ring 116 may provide aesthetic appeal and prevents any prime device inserted between the boards to remove or separate the adaptor from damaging traces on the boards.

Although not illustrated or described in particular, in accordance with yet a further embodiment of the invention, a printed circuit board can be formed with peripheral traces in accordance with the method of the invention described above with reference to FIGS. 2 and 3 and can be mounted to a surface mount mother board or daughter board so as to extend perpendicularly with respect thereto. Such a mounting configuration further increase the versatility of the board in accordance with the invention.

Figure 12:
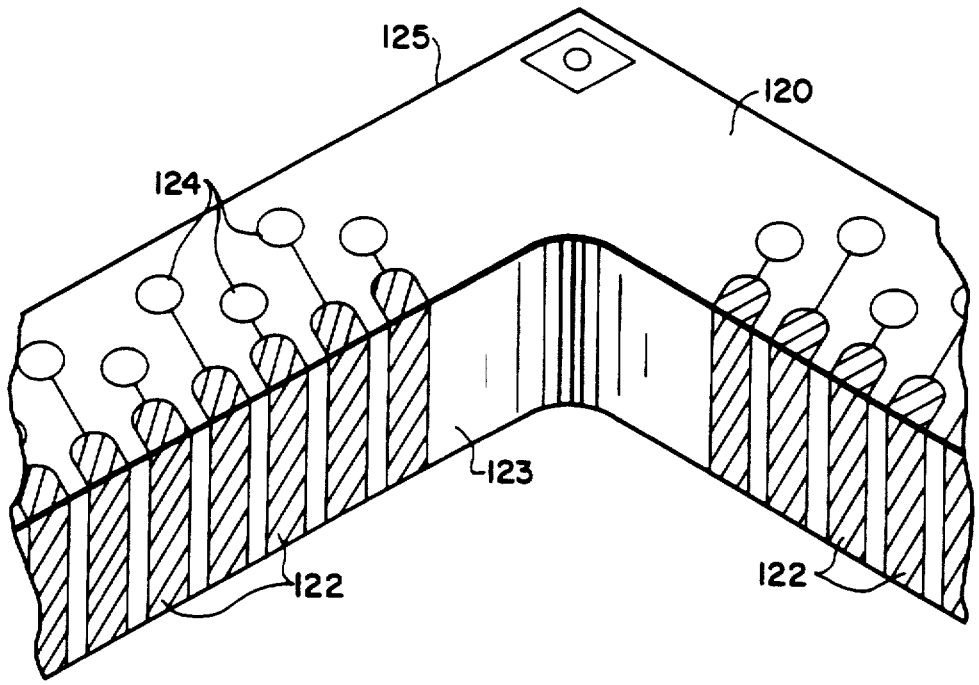
FIG. 12 is a perspective view, partly broken away for clarity, of a stack pack PLCC chip carrier in accordance with the present invention.

In accordance with yet a further embodiment of the invention, traces can be formed along an interior peripheral edge 123 of a printed circuit board. The outer peripheral edge is identified with reference numeral 125. More particularly, as shown in FIG. 12, a printed circuit board 120 can be formed as a window having traces 122 formed in accordance with the method of the invention on the peripheral side edges of the interior of the window. Such a window-like printed circuit board 120 in accordance with the invention can be soldered to a surface mount mother board and thus define a socket for a PLCC chip. In addition or in the alternative, a plurality of such PLCC chip carriers can be mounted vertically above one another for mounting a plurality of PLCC chips in parallel. The chip carriers can be interconnected by soldering or by mounting pins to selected apertures 124 provided with mosquito clips so as to provide a male-female chip carrier interconnection. As yet a further alternative, one or more rods may be inserted through aligned apertures 124 of stacked chip carriers and the entire stack soldered together in that manner. The "window" permits containment of the PLCC chip carrier within the window, thus reducing overall space requirements.

What is claimed is:

1. A method of forming traces on a peripheral side edge of a printed circuit board comprising:
   providing a printed circuit board having at least one connector pattern defined thereon;
   forming a plurality of trace bores about a periphery of said connector pattern;
   plating through all holes on said printed circuit board;
   after said step of plating, masking all holes on said printed board except said trace bores;
   after said step of masking, filling said trace bores with solder; and
   cutting said printed circuit board along a line defined by said trace bores so as to expose at least a portion of the solder in said trace bores, thereby defining a printed circuit board having a plurality of distinct traces along peripheral side edge thereof.

2. A printed circuit board formed by the method of claim 1.

3. A method as in claim 1, wherein said step of forming a plurality of trace bores comprises drilling a series of holes in said printed circuit board in surrounding relation to said connector pattern so that cutting said printed circuit board along said line defined by said trace bores defines a printed circuit board having a plurality of distinct traces along an outer peripheral side edge thereof.

4. A method as in claim 1, wherein said step of forming a plurality of trace bores comprises drilling a series of holes in said printed circuit board about an inner periphery of said connector pattern whereby said step of cutting said printed circuit board along a line defined by said trace bores defines a printed circuit board having a plurality of distinct traces along an inner peripheral side edge thereof.

5. A method as in claim 1, wherein said step of forming a plurality of trace bores and filling said trace bores comprises forming a first array of trace bores and filling said first array of trace bores with solder and then forming a second array of trace bores which are one of slightly outward, slightly inward, and along the same line as said first array of trace bores, and said step of cutting comprises cutting along a line defined by said first array of trace bores whereby grooves are defined between each of said traces along said peripheral side edge of said printed circuit board.

6. A printed circuit board formed by the method of claim 3.

7. A printed circuit board formed by the method of claim 4.

8. A printed circuit board having at least one connector pattern defined thereon and having a window defined therethrough so that said printed circuit board has an inner peripheral side edge and an outer peripheral side edge; and a plurality of part cylindrical cut-outs defined along at least one of said inner and said outer peripheral side edges, each said part cylindrical cut-out having solder disposed therewithin.

9. A printed circuit board as in claim 8, wherein at least one of said at least one part cylindrical cut-outs has a longitudinal axis substantially perpendicular to a horizontal plane of said printed circuit board.

10. A printed circuit board as in claim 8, wherein said side edge is a peripheral side edge defined in surrounding relation to said at least one connector pattern so that said printed circuit board has a plurality of distinct traces defined along an outer peripheral side edge thereof.

11. A printed circuit board as in claim 8, wherein said side edge is defined about an inner periphery of said connector pattern so that said cut-outs having said solder therein define a plurality of distinct traces along an inner peripheral side edge of said printed circuit board.

12. A printed circuit board having at least one connector pattern defined thereon and having a side edge; and at least one part cylindrical cut-out defined on said peripheral side edge, said at least one part cylindrical cut-out having solder disposed therewithin, said solder projecting beyond the respective side edge of the board.

13. A printed circuit board having at least one connector pattern defined thereon and having a side edge; and at least two part cylindrical cut-outs defined on said peripheral side edge, each said part cylindrical cut-out having solder disposed therewithin, and a further part cylindrical cut-out defined between each adjacent pair of said at least two part cylindrical cut-outs.

* * * * *